(12) United States Patent
Zeng et al.

(10) Patent No.: US 10,068,830 B2
(45) Date of Patent: Sep. 4, 2018

(54) COMPRESSIBLE THERMAL INTERFACE MATERIALS

(71) Applicants: HONEYWELL INTERNATIONAL INC., Morristown, NJ (US); Liang Zeng, Morristown, NJ (US); Ya Qun Liu, Morristown, NJ (US); Jerry Chang, Morristown, NJ (US); Bright Zhang, Morristown, NJ (US); Zhe Ding, Morristown, NJ (US); Wei Jun Wang, Morristown, NJ (US); Hong Min Huang, Morristown, NJ (US)

(72) Inventors: Liang Zeng, Shanghai (CN); Ya Qun Liu, Shanghai (CN); Wei Chang, Shanghai (CN); Liqiang Zhang, Shanghai (CN); Zhe Ding, Shanghai (CN); Wei Jun Wang, Shanghai (CN); Hong Min Huang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 102 days.

(21) Appl. No.: 15/117,862

(22) PCT Filed: Feb. 4, 2015

(86) PCT No.: PCT/CN2015/072202
§ 371 (c)(1),
(2) Date: Aug. 10, 2016

(87) PCT Pub. No.: WO2015/120773
PCT Pub. Date: Aug. 20, 2015

(65) Prior Publication Data
US 2017/0018481 A1  Jan. 19, 2017

Related U.S. Application Data

(60) Provisional application No. 61/939,412, filed on Feb. 13, 2014.

(51) Int. Cl.
*F28F 7/00* (2006.01)
*H01L 23/373* (2006.01)
(Continued)

(52) U.S. Cl.
CPC .......... *H01L 23/3737* (2013.01); *C09K 5/063* (2013.01); *H01L 23/367* (2013.01); *H01L 23/42* (2013.01); *H01L 2924/0002* (2013.01)

(58) Field of Classification Search
CPC ............................... B32B 27/00; B32B 27/32
(Continued)

(56) References Cited

U.S. PATENT DOCUMENTS 4,832,781 A   5/1989  Mears
5,930,115 A   7/1999  Tracy et al.
(Continued)

FOREIGN PATENT DOCUMENTS

CA    2433637 A1   12/2002
CN    100394566 C   3/2006
(Continued)

OTHER PUBLICATIONS

"Phase Change Material: DAPCM80-1",MH&W International Corp., May 2012, http://mhw-thermal.com, 1 pages.
(Continued)

*Primary Examiner* — Khanh T Nguyen
(74) *Attorney, Agent, or Firm* — Faegre Baker Daniels LLP

(57) ABSTRACT

Provided is a compressible thermal interface material including a polymer, a thermally conductive filler, and a phase change material. A formulation for forming a compressible thermal interface material and an electronic component including a compressible thermal interface material are also provided.

20 Claims, 8 Drawing Sheets

(51) Int. Cl.
*H01L 23/42* (2006.01)
*C09K 5/06* (2006.01)
*H01L 23/367* (2006.01)

(58) Field of Classification Search
USPC .............................. 165/185; 428/339, 517
See application file for complete search history.

(56) References Cited

U.S. PATENT DOCUMENTS

| | | |
|---|---|---|
| 5,950,066 A | 9/1999 | Hanson et al. |
| 6,054,198 A | 4/2000 | Bunyan et al. |
| 6,165,612 A | 12/2000 | Misra |
| 6,197,859 B1 | 3/2001 | Green et al. |
| 6,238,596 B1 | 5/2001 | Nguyen et al. |
| 6,372,997 B1 | 4/2002 | Hill et al. |
| 6,451,422 B1 | 9/2002 | Nguyen |
| 6,496,373 B1 | 12/2002 | Chung |
| 6,506,332 B2 | 1/2003 | Pedigo |
| 6,605,238 B2 | 8/2003 | Nguyen et al. |
| 6,616,999 B1 | 9/2003 | Freuler et al. |
| 6,617,517 B2 | 9/2003 | Hill et al. |
| 6,657,297 B1 | 12/2003 | Jewram et al. |
| 6,673,434 B2 | 1/2004 | Nguyen |
| 6,706,219 B2 | 3/2004 | Nguyen |
| 6,761,928 B2 | 7/2004 | Hill et al. |
| 6,797,382 B2 | 9/2004 | Nguyen et al. |
| 6,811,725 B2 | 11/2004 | Nguyen et al. |
| 6,841,757 B2 | 1/2005 | Marega et al. |
| 6,908,669 B2 | 6/2005 | Nguyen |
| 6,921,780 B2 | 7/2005 | Ducros et al. |
| 6,940,721 B2 | 9/2005 | Hill |
| 6,946,190 B2 | 9/2005 | Bunyan |
| 6,984,685 B2 | 1/2006 | Misra et al. |
| 7,013,965 B2 | 3/2006 | Zhong et al. |
| 7,038,009 B2 | 5/2006 | Sagal et al. |
| 7,056,566 B2 | 6/2006 | Freuler et al. |
| 7,074,490 B2 | 7/2006 | Feng et al. |
| 7,078,109 B2 | 7/2006 | Hill et al. |
| 7,119,143 B2 | 10/2006 | Jarnjevic et al. |
| 7,172,711 B2 | 2/2007 | Nguyen |
| 7,208,191 B2 | 4/2007 | Freedman |
| 7,244,491 B2 | 7/2007 | Nguyen |
| 7,253,523 B2 | 8/2007 | Dani et al. |
| 7,262,369 B1 | 8/2007 | English |
| 7,294,394 B2 | 11/2007 | Jayaraman et al. |
| RE39,992 E | 1/2008 | Misra et al. |
| 7,326,042 B2 | 2/2008 | Alper et al. |
| 7,328,547 B2 | 2/2008 | Mehta et al. |
| 7,369,411 B2 | 5/2008 | Hill et al. |
| 7,440,281 B2 | 10/2008 | Bailey et al. |
| 7,446,158 B2 | 11/2008 | Okamoto et al. |
| 7,463,496 B2 | 12/2008 | Robinson et al. |
| 7,572,494 B2 | 8/2009 | Mehta et al. |
| 7,608,324 B2 | 10/2009 | Nguyen et al. |
| 7,682,690 B2 | 3/2010 | Bunyan et al. |
| 7,732,829 B2 | 6/2010 | Murphy |
| 7,763,673 B2 | 7/2010 | Okamoto et al. |
| RE41,576 E | 8/2010 | Bunyan et al. |
| 7,765,811 B2 | 8/2010 | Hershberger et al. |
| 7,807,756 B2 | 10/2010 | Wakabayashi et al. |
| 7,842,381 B2 | 11/2010 | Johnson |
| 7,867,609 B2 | 1/2011 | Nguyen |
| 7,893,170 B2 | 2/2011 | Wakioka et al. |
| 7,973,108 B2 | 7/2011 | Okamoto et al. |
| 8,009,429 B1 | 8/2011 | Sundstrom et al. |
| 8,076,773 B2 | 12/2011 | Jewram et al. |
| 8,081,468 B2 | 12/2011 | Hill et al. |
| 8,102,058 B2 | 1/2012 | Hsieh et al. |
| 8,110,919 B2 | 2/2012 | Jewram et al. |
| 8,112,884 B2 | 2/2012 | Tullidge et al. |
| 8,115,303 B2 | 2/2012 | Bezama et al. |
| 8,167,463 B2 | 5/2012 | Loh |
| 8,223,498 B2 | 7/2012 | Lima |
| 8,362,607 B2 | 1/2013 | Scheid et al. |
| 8,445,102 B2 | 5/2013 | Strader et al. |
| 8,587,945 B1 | 11/2013 | Hartmann et al. |
| 2003/0031876 A1 | 2/2003 | Obeng et al. |
| 2003/0068487 A1 | 4/2003 | Nguyen et al. |
| 2003/0207064 A1 | 11/2003 | Bunyan et al. |
| 2005/0072334 A1 | 4/2005 | Czubarow et al. |
| 2006/0264566 A1 | 11/2006 | Cassar et al. |
| 2007/0051773 A1 | 3/2007 | Ruchert et al. |
| 2007/0116626 A1 | 5/2007 | Pan et al. |
| 2007/0179232 A1 | 8/2007 | Collins et al. |
| 2007/0219312 A1 | 9/2007 | David |
| 2008/0044670 A1 | 2/2008 | Nguyen |
| 2008/0269405 A1 | 10/2008 | Okamoto et al. |
| 2009/0053515 A1 | 2/2009 | Luo et al. |
| 2009/0072408 A1 | 3/2009 | Kabir et al. |
| 2009/0111925 A1 | 4/2009 | Burnham et al. |
| 2010/0040768 A1 | 2/2010 | Dhindsa |
| 2010/0129648 A1 | 5/2010 | Xu et al. |
| 2010/0256280 A1 | 10/2010 | Bruzda |
| 2010/0304152 A1 | 12/2010 | Clarke |
| 2011/0000516 A1 | 1/2011 | Hershberger et al. |
| 2011/0038124 A1 | 2/2011 | Burnham et al. |
| 2011/0204280 A1 | 8/2011 | Bruzda |
| 2011/0205708 A1 | 8/2011 | Andry et al. |
| 2011/0265979 A1 | 11/2011 | Chen et al. |
| 2011/0308782 A1 | 12/2011 | Merrill et al. |
| 2012/0048528 A1 | 3/2012 | Bergin et al. |
| 2012/0087094 A1 | 4/2012 | Hill et al. |
| 2012/0142832 A1 | 6/2012 | Varma et al. |
| 2012/0174956 A1 | 7/2012 | Smythe et al. |
| 2012/0182693 A1 | 7/2012 | Boday et al. |
| 2012/0280382 A1 | 11/2012 | Im et al. |
| 2012/0292005 A1 | 11/2012 | Bruzda et al. |
| 2013/0127069 A1 | 5/2013 | Boday et al. |
| 2013/0285233 A1 | 10/2013 | Bao et al. |
| 2014/0043754 A1 | 2/2014 | Hartmann et al. |

FOREIGN PATENT DOCUMENTS

| | | |
|---|---|---|
| CN | 103333447 A | 10/2013 |
| DE | 102009001722 A1 | 9/2010 |
| DE | 1020070037435 B4 | 3/2012 |
| EP | 0816423 A1 | 1/1998 |
| EP | 1291913 A3 | 3/2003 |
| EP | 1414063 A3 | 4/2004 |
| JP | 2005032468 A | 2/2005 |
| JP | 2007131798 A | 5/2007 |
| JP | 04480457 B2 | 3/2010 |
| JP | 2012119725 A | 6/2012 |
| KR | 100820902 B1 | 4/2008 |
| KR | 953679 B2 | 4/2010 |
| KR | 1175948 B1 | 8/2012 |
| TW | 569348 B | 1/2004 |
| TW | 201546257 A | 12/2015 |
| WO | 2001093648 A3 | 12/2001 |
| WO | 2013074920 A1 | 5/2013 |
| WO | 2015120773 A1 | 8/2015 |

OTHER PUBLICATIONS

International Search Report and Written Opinion issued in PCT/CN2015/072202, dated Apr. 29, 2015, 14 pages.
Extended European Search Report issued in EP Application 15749120.0, dated Aug. 11, 2017, 6 pages.

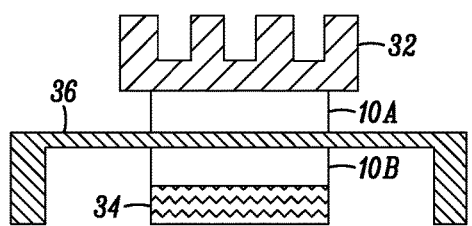 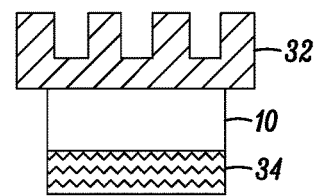
*FIG. 1A*  *FIG. 1B*
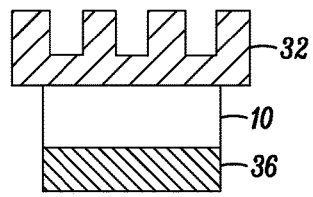 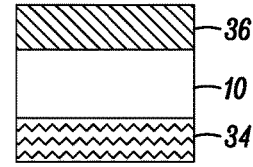
*FIG. 1C*  *FIG. 1D* ated as WO  2015/120773 on Aug. 20, 2015, which claims the benefit
COMPRESSIBLE THERMAL INTERFACE MATERIALS

CROSS-REFERENCE TO RELATED APPLICATION

This application is the U.S. national stage of PCT/CN2015/072202, filed Feb. 4, 2015, published as WO 2015/120773 on Aug. 20, 2015, which claims the benefit under Title 35, U.S.C. § 119(e) of U.S. Provisional Patent Application Ser. No. 61/939,412 filed Feb. 13, 2014, each of which is hereby incorporated by reference herein in its entirety.

FIELD OF THE INVENTION

The present disclosure relates generally to thermal interface materials, and more particularly to compressible thermal interface materials.

DESCRIPTION OF RELATED ART

Thermal interface materials are widely used to dissipate heat from electronic components, such as central processing units, video graphics arrays, servers, game consoles, smart phones, LED boards, and the like. Thermal interface materials are typically used to transfer excess heat from the electronic component to a heat spreader, such as a heat sink.

Thermal interface materials include thermal grease, grease-like materials, elastomer tapes, and phase change materials. Traditional thermal interface materials include components such as gap pads and thermal pads.

Exemplary thermal interface materials are disclosed in the following patents and applications, the disclosures of which are hereby incorporated by reference in their entirety: U.S. Pat. No. 6,238,596, U.S. Pat. No. 6,451,422, U.S. Pat. No. 6,605,238, U.S. Pat. No. 6,673,434, U.S. Pat. No. 6,706,219, U.S. Pat. No. 6,797,382, U.S. Pat. No. 6,811,725, U.S. Pat. No. 7,172,711, U.S. Pat. No. 7,244,491, U.S. Pat. No. 7,867,609, U.S.2007/0051773, U.S. 2008/0044670, U.S. 2009/0111925, U.S. 2010/0129648, and U.S. 2011/0308782.

It is desirable for thermal interface materials to have excellent thermal performance and compressibility.

SUMMARY OF THE INVENTION

The present disclosure provides compressible thermal interface materials that are useful in transferring heat from heat generating electronic devices, such as computer chips, to heat dissipating structures, such as heat spreaders and heat sinks.

In one exemplary embodiment, a compressible thermal interface material is provided. The compressible TIM includes a polymer; a thermally conductive filler; and a phase change material. The phase change material includes a wax having a needle penetration value of at least 50 as determined by ASTM D1321. In one more particular embodiment, the compressible thermal interface material has a compressibility of at least 5% under a pressure of 40 psi. In another more particular embodiment, the compressible thermal interface material has a springback ratio of 50% or less. In still yet another more particular embodiment, the phase change material comprises a second wax, the second wax having a needle penetration value of less than 50 as determined by ASTM D1321. In another more particular embodiment, the phase change material comprises a wax selected from the group consisting of: a polyethylene wax, a copolymer of ethylene-vinyl acetate wax, and an oxidized polyethylene wax. In a more particular embodiment of any of the above embodiments, the thermally conductive filler comprises aluminum. In another more particular embodiment, the thermally conductive filler comprises 10 wt. % to 95 wt. % of the total weight of the compressible thermal interface material. In a more particular embodiment of any of the above embodiments, the polymer is selected from the group consisting of: ethylene-propylene rubbers (EPR), ethylene-propylene diene monomer rubbers (EPDM), polyethylene-butylene, and polyethylene-butylene-styrene, polybutadiene, hydrogenated polybutadiene mono-ol, hydrogenated polypropadiene mono-ol, hydrogenated polypentadiene mono-ol, polybutadiene diol, hydrogenated polypropadiene diol, and hydrogenated polypentadiene diol. In an even more particular embodiment, the polymer is hydrogenated polybutadiene. In a more particular embodiment of any of the above embodiments, the compressible TIM further includes a coupling agent, an antioxidant, and a crosslinking agent.

In a more particular embodiment of any of the above embodiments, the compressible TIM further includes a silicone gel.

In another more particular embodiment of any of the above embodiments, the compressible TIM includes a middle layer comprising the polymer, the thermally conductive filler, and the wax having a needle penetration value of at least 50 as determined by ASTM D132; a first surface layer including at least one phase change material and at least one thermally conductive filler; and a second surface layer including at least one phase change material and at least one thermally conductive filler. In a more particular embodiment, a weight percentage content of thermally conductive filler in the middle layer is less than or equal to the weight percentage content of thermally conductive filler in at least one of the first and second surface layers. In another more particular embodiment, the weight percentage of thermally conductive filler in each of the first and second surface layers is independently from about 70 wt. % to about 99 wt. %.

In another embodiment, a formulation for forming a compressible thermal interface material is provided. The formulation includes a solvent; a polymer; a thermally conductive filler; and a phase change material, wherein the phase change material includes a wax having a needle penetration value of at least 50 as determined by ASTM D1321. In a more particular embodiment, the formulation has a viscosity of 1,000 centipoise to 100,000,000 centipoise.

In another embodiment, an electronic component is provided. The electronic component includes a heat sink, an electronic chip, and a compressible thermal interface material positioned between the heat sink and electronic chip, the compressible thermal interface material including: a polymer, a thermally conductive filler, and a wax having a needle penetration value of at least 50 as determined by ASTM D1321. In a more particular embodiment, a first surface of the compressible thermal interface material is in contact with a surface of the electronic chip and a second surface of the compressible thermal interface material is in contact with the heat sink. In another more particular embodiment, the electronic component includes a heat spreader positioned between the heat sink and the electronic chip, wherein a first surface of the compressible thermal interface material is in contact with a surface of the electronic chip and a second surface of the compressible thermal interface material is in contact with the heat spreader. In still yet another more particular embodiment, the electronic component includes a heat spreader positioned between the heat sink and the electronic chip, wherein a first surface of the compressible thermal interface material is in contact with a surface of the heat spreader and a second surface of the compressible thermal interface material is in contact with the heat sink.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein:

FIG. 1A schematically illustrates an electronic chip, a heat spreader, a heat sink, and first and second thermal interface materials;

FIG. 1B schematically illustrates an exemplary thermal interface material positioned between an electronic chip and a heat sink;

FIG. 1C schematically illustrates an exemplary thermal interface material positioned between a heat spreader and a heat sink;

FIG. 1D schematically illustrates an exemplary thermal interface material positioned between an electronic chip and a heat spreader;

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

Figure 2A:
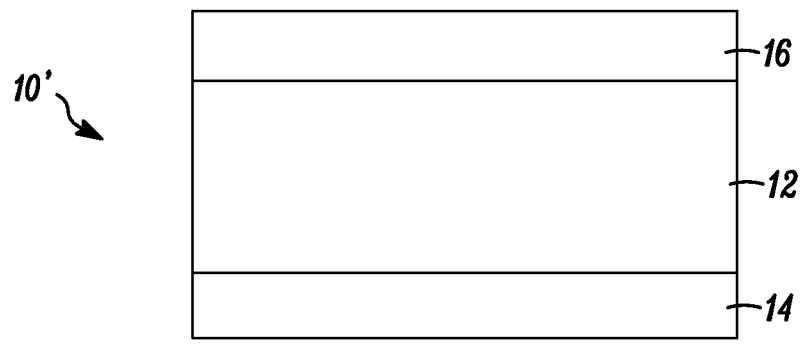
FIG. 2A schematically illustrates an exemplary multilayer thermal interface material.

The present invention relates to thermal interface materials useful in transferring heat away from electronic components.

FIG. 1A schematically illustrates an electronic chip 34, a heat spreader 36, and a heat sink 32 with a first thermal interface material (TIM) 10A connecting the heat sink 32 and heat spreader 36 and a second thermal interface material 10B connecting the heat spreader 36 and electronic chip 34. One or both of thermal interface materials 10A, 10B may be a compressible thermal interface material, as described below. FIG. 1B illustrates the exemplary thermal interface material 10 as a thermal interface layer designated as a TIM 1.5 positioned between an electronic chip 34 and a heat sink 32, such that a first surface of TIM 10 is in contact with a surface of electronic chip 34 and a second surface of TIM 10 is in contact with a surface of heat sink 32. FIG. 1C illustrates the exemplary thermal interface material 10 as a thermal interface material designated as a TIM 2 positioned between a heat spreader 36 and a heat sink 32, such that a first surface of TIM 10 is in contact with a surface of heat spreader 36 and a second surface of TIM 10 is in contact with a surface of heat sink 32. FIG. 1D illustrates an exemplary thermal interface material 10 as a thermal interface material designated as a TIM 1 positioned between an electronic chip 34 and a heat spreader 36 such that a first surface of TIM 10 is in contact with a surface of electronic chip 34 and a second surface of TIM 10 is in contact with a surface of heat spreader 36.

Although TIM 10 is illustrated as a single continuous layer in FIG. 1, in other embodiments, TIM 10 may be comprised of more than one layer (see FIG. 2A), wherein each layer may be composed of the same or different materials.

In some exemplary embodiments, the TIM 10 further comprises a thermal sheet. In some exemplary embodiments, the TIM 10 further comprises an dielectric layer. In some exemplary embodiments, the TIM 10 further comprises a thermal foil.

In some exemplary embodiments, the thermal interface material 10 is used in a smartphone, a tablet computer, a laptop computer, a desktop computer, a gaming console, a server, a telecom base station, a wireless router or other component, a light emitting diode (LED), a power module, an autoelectronic device, or insulated-gate bipolar transistor (IGBT).

A. Compressible Thermal Interface Material

In one exemplary embodiment, the TIM 10 is a compressible thermal interface material. In some exemplary embodiments, compressible TIM 10 comprises one or more polymers, one or more phase change materials, one or more thermally conductive fillers, and, optionally, additives. In some exemplary embodiments, TIM 10 comprises one or more elastomers containing one or more thermally conductive fillers.

a. Thermally Conductive Filler

In some exemplary embodiments, the TIM 10 includes one or more thermally conductive fillers. Exemplary thermally conductive fillers include metals, alloys, nonmetals, metal oxides and ceramics, and combinations thereof. Exemplary metals include but are not limited to aluminum, copper, silver, zinc, nickel, tin, indium, and lead. Exemplary nonmetals include but are not limited to carbon, graphite, carbon nanotubes, carbon fibers, graphenes, and silicon nitride. Exemplary metal oxides and ceramics include but are not limited to alumina, aluminum nitride, boron nitride, zinc oxide, and tin oxide.

The TIM 10 may comprise the one or more thermally conductive fillers in an amount as little as 10 wt. %, 20 wt. %, 25 wt. %, 50 wt. %, as great as 75 wt. %, 80 wt. %, 85 wt. %, 90 wt. %, 95 wt. %, or within any range defined between any two of the foregoing values, based on the total weight of the TIM 10.

b. Polymer Matrix

In some exemplary embodiments, the TIM 10 further comprises a polymer, such as an elastomer. Exemplary polymers include silicone elastomers, silicone rubbers, ethylene copolymers, such as ethylene-propylene rubbers (EPR) ethylene-propylene diene monomer rubbers (EPDM), polyethylene-butylene, and polyethylene-butylene-styrene, polyalkyldienes such as polybutadiene, and hydrogenated polymers such as hydrogenated polyalkyldiene mono-ols (including hydrogenated polybutadiene mono-ol, hydrogenated polypropadiene mono-ol, and hydrogenated polypentadiene mono-ol), and hydrogenated polyalkyldiene diols (including hydrogenated polybutadiene diol, hydrogenated polypropadiene diol, and hydrogenated polypentadiene diol).

In some exemplary embodiments, the TIM 10 includes one or more silicone gels. In some embodiments, the TIM 10 may comprise the one or more silicone gels in an amount as little as 0.1 wt. %, 0.5 wt. %, 1 wt. % 1.5 wt. %, 2 wt. %, as great as 5 wt. %, 10 wt. %, 15 wt. %, or within any range defined between any two of the foregoing values, based on the total weight of the central layer 12.

c. Phase Change Material

In some exemplary embodiments, the TIM 10 comprises one or more phase change materials. A phase change material is a material having a melting point or melting point range at or below the operating temperature of a portion of an electronic device in which the TIM 10 is to be used. An exemplary phase change material is a wax. Other exemplary phase change materials include low melting alloys, such as Wood's metal, Field's metal, or a metal or alloy having a melting point between about 20° C. and 90° C.

In some embodiments, the phase change material has a phase change temperature as low as 20° C., 30° C., 40° C., 45° C. 50° C., as high as 60° C., 70° C., 80° C., 90° C., 100° C., 110° C., or within any range defined between any two of the foregoing values. In some more particular embodiments, the phase change material has a phase change temperature as low as 30° C., 40° C., 45° C. as high as 50° C., 60° C., 70° C., or within any range defined between any two of the foregoing values.

The hardness of a wax may be characterized by a needle penetration value, such as a needle penetration value determined in accordance with ASTM D1321 at 25° C., the disclosures of which are hereby incorporated by reference in their entirety.

In some exemplary embodiments, the TIM 10 comprises one or more waxes having an ASTM D1321 needle penetration value as low as 40, 50, 60, as high as 70, 80, 90, 100, or greater, or within any range defined by any two of the foregoing values. In some exemplary embodiments, the TIM 10 comprises one or more waxes having an ASTM D1321 needle penetration value of at least 50. In some exemplary embodiments, the TIM 10 comprises one or more waxes having an ASTM D1321 needle penetration value of at least 60. In some exemplary embodiments, the TIM 10 comprises one or more waxes having an ASTM D1321 needle penetration value of at least 70.

Exemplary waxes having an ASTM D1321 needle penetration value greater than 70 include AC-1702 (a polyethylene wax), AC-430 (a copolymer of ethylene-vinyl acetate wax), and AC-6702 (an oxidized polyethylene wax), each available from Honeywell International Inc.

In some exemplary embodiments, the central layer 12 comprises at least two waxes, wherein the first wax is harder than the second wax. In some exemplary embodiments, the weight ratio of the softer wax based on the total weight of the waxes is as little as 10%, 25%, 50%, as high as 75%, 95%, 99%, or within any range defined between any two of the foregoing values.

In some exemplary embodiments, the first wax has an ASTM D1321 needle penetration value of less than 70 and the second wax has an ASTM D1321 needle penetration value of at least 70 or greater. In some exemplary embodiments, at least one of the first wax and second wax includes a polyethylene wax blended with polytetrafluoroethylene. An exemplary polytetrafluoroethylene-polyethylene wax mixture is PEW-0602F wax available from Nanjing Tianshi New Material Technologies.

An exemplary wax having an ASTM D1321 needle penetration value less than 70 includes TAC wax, available from The International Group, Inc., and RT44HC, available from Hangzhou Ruhr Tech.

d. Additives

In some exemplary embodiments, the TIM 10 comprises one or more additives. Exemplary additives include antioxidants, crosslinkers, and coupling agents, including titanate coupling agents. In some exemplary embodiments, the TIM 10 may comprise the one or more additives in an amount as little as 0.1 wt. %, 0.5 wt. %, 1 wt. % as great as 1.5 wt. %, 2 wt. %, 5 wt. %, 10 wt. %, or within any range defined between any two of the foregoing values, based on the total weight of the central layer.

B. Multilayer Thermal Interface Material

In some embodiments, the TIM is a multilayer thermal interface material ("TIM") 10'. Referring first to FIG. 2A, an exemplary multilayer 10' is illustrated. MultilayerTIM 10' includes a central layer 12, first surface layer 14, and second surface layer 16.

Although certain components are exemplified below as being a part of the central layer 12, first surface layer 14, and/or second surface layer 16, in some embodiments, each component may be found in any of the central layer 12, the first surface layer 14, and the second surface layer 16

1. Central Layer

As illustrated in FIG. 2A, central layer 12 is positioned between first surface layer 14 and second surface layer 16. In some embodiments, central layer 12 is directly in contact with first surface layer 14 and second surface layer 16. Although central layer 12 is illustrated as a single continuous layer in FIG. 2A, in other embodiments, central layer 12' may be comprised of more than one layer, wherein each layer may be composed of the same or different materials (see FIG. 2B).

In some exemplary embodiments, the central layer 12 has a composition similar to that of the TIM 10 as described above. In some exemplary embodiments, the central layer 12 comprises one or more polymers, one or more phase change materials, one or more thermally conductive fillers, and, optionally, additives, as described above with respect to TIM 10. In some exemplary embodiments, the central layer 12 comprises one or more elastomers containing one or more thermally conductive fillers. In some exemplary embodiments, the central layer 12 includes a compressible material. In some embodiments, when subjected to a pressure of 40 psi, the central layer 12 has a compressibility as little as at least 5%, at least 10%, at least 15%, at least 20%, at least 30%, and as high as at least 40%, at least 50%, at least 60%, at least 70%, at least 80%, or within any range defined between any two of the foregoing values. In some exemplary embodiments, the central layer returns to its original thickness following release of the pressure. In other exemplary embodiments, the central layer does not return to its original thickness following release of the pressure.

Figure 2B:
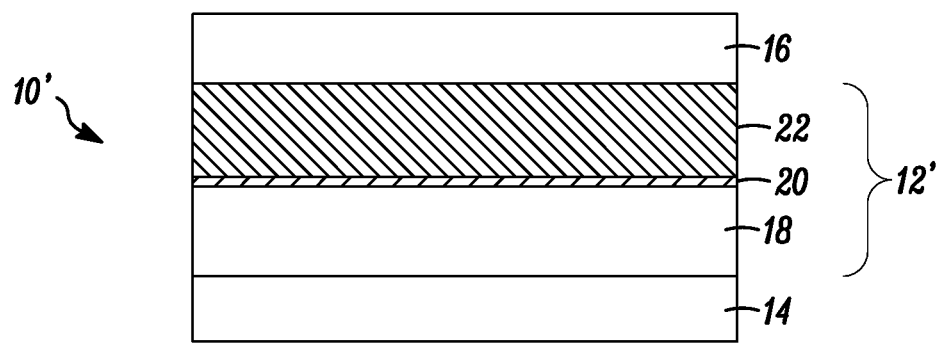
FIG. 2B schematically illustrates an exemplary multilayer thermal interface material including EMI shielding.

Referring next to FIG. 2B, in some exemplary embodiments, the central layer 12' comprises a gap pad 18, a phase change material 20, and an electromagnetic interference shielding sheet 22. Typical materials used for electromagnetic shielding include metal sheets, metal screens, metal foam, and a coating including nano- or sub-micron size metal particles, such as copper or nickel. In some exemplary embodiments, the central layer 12 further comprises a thermal sheet. In some exemplary embodiments, the central layer 12 further comprises an dielectric layer. In some exemplary embodiments, the central layer 12 further comprises a thermal foil.

a. Thermally Conductive Filler

In some exemplary embodiments, the central layer 12 includes one or more thermally conductive fillers. In some exemplary embodiments, the weight percentage of thermally conductive filler in the central layer 12 is less than or equal to the weight percentage of thermally conductive filler in either the first surface layer 14 or second surface layer 16. In some exemplary embodiments, the central layer 12 has a thermal conductivity less than or equal to the thermal conductivity of both the first and second surface layers. The central layer 12 may comprise the one or more thermally conductive fillers in an amount as little as 10 wt. %, 20 wt. %, 25 wt. %, 50 wt. %, as great as 75 wt. %, 80 wt. %, 85 wt. %, 90 wt. %, 95 wt. %, or within any range defined between any two of the foregoing values, based on the total weight of the central layer 12.

b. Polymer Matrix

In some exemplary embodiments, the central layer 12 further comprises a polymer, such as an elastomer. In some exemplary embodiments, the central layer includes one or more silicone gels. In some embodiments, the central layer 12 may comprise the one or more silicone gels in an amount as little as 0.1 wt. %, 0.5 wt. %, 1 wt. % 1.5 wt. %, 2 wt. %, as great as 5 wt. %, 10 wt. %, 15 wt. %, or within any range defined between any two of the foregoing values, based on the total weight of the central layer 12.

c. Phase Change Material

In some exemplary embodiments, the central layer 12 comprises one or more phase change materials. In some exemplary embodiments, the central layer 12 comprises one or more waxes having an ASTM D1321 needle penetration value as low as 40, 50, 60, as high as 70, 80, 90, 100, or greater, or within any range defined by any two of the foregoing values. In some exemplary embodiments, the central layer 12 comprises one or more waxes having an ASTM D1321 needle penetration value of at least 50. In some exemplary embodiments, the central layer 12 comprises one or more waxes having an ASTM D1321 needle penetration value of at least 60. In some exemplary embodiments, the central layer 12 comprises one or more waxes having an ASTM D1321 needle penetration value of at least 70.

d. Additives

In some exemplary embodiments, the central layer 12 comprises one or more additives. In some exemplary embodiments, the central layer 12 may comprise the one or more additives in an amount as little as 0.1 wt. %, 0.5 wt. %, 1 wt. % as great as 1.5 wt. %, 2 wt. %, 5 wt. %, 10 wt. %, or within any range defined between any two of the foregoing values, based on the total weight of the central layer 2. Surface Layers In some exemplary embodiments, first surface layer 14 is comprised of the same material as second surface layer 16. In other exemplary embodiments, first surface layer 14 is comprised of a different material than second surface layer 16. Exemplary materials that may be useful as first surface layer 14 and/or second surface layer 16 are disclosed in the following patents and applications, the disclosures of which are hereby incorporated by reference in their entirety: U.S. Pat. No. 6,451,422; U.S. Pat. No. 6,605,238; U.S. Pat. No. 6,673,434; U.S. Pat. No. 7,867,609; U.S. Pat. No. 6,797,382; U.S. Pat. No. 6,908,669; U.S. Pat. No. 7,244,491; U.S. 2007/0051773; U.S. 2011/0308782; and U.S. 2011/0038124.

Exemplary materials from which the first surface layer 14 and/or second surface layer 16 may be formed include PCM, LTM, and/or PTM series materials available from Honeywell International Inc. One exemplary PCM material is PCM45F, which is a substantially incompressible material comprising a polymer, a phase change material, and a thermally conductive filler. Another exemplary PCM material is PCM45F-SP, which is a screen-printable version of PCM45F comprising a polymer, a phase change material, and a thermally conductive filler. One exemplary PTM material is PMT3180, which is a substantially incompressible material comprising a polymer, a phase change material, and a thermally conductive filler. Another exemplary material is TS27, which is a compressible thermal interface material comprising a polymer, a hard wax and a soft wax and a thermally conductive filler. Another exemplary material is TC5026, which is a thermal grease including a thermally conductive filler, available from Dow Corning, Midland Mich.

In some exemplary embodiments, each of the first and second surface layers 14, 16 are hard or substantially incompressible. In some exemplary embodiments, each of the first and second surface layers 14, 16, has a compressibility less than that of the central layer 12 when subjected to a pressure of 40 psi. In some embodiments, when subjected to a pressure of 40 psi, each of the first and second surface layers 14, 16 has a compressibility as little as 0%, 1%, 2%, as high 3%, 5%, or within any range defined between any two of the foregoing values. In some embodiments, when subjected to a pressure of 40 psi, each of the first and second surface layers 14, 16 has a compressibility of 5% or less. In other exemplary embodiments, each of the each of the first and second surface layers 14, 16 are compressible. In some embodiments, when subjected to a pressure of 40 psi, each of the first and second surface layers 14, 16 has a compressibility as little as 5%, 10%, 20%, 25%, as great as 50%, 75%, 80%, or within any range defined between any two of the foregoing values.

In some exemplary embodiments, each of the first and second surface layer 14, 16 has a Shore A hardness according to ASTM D2240, the disclosure of which is hereby incorporated by reference in its entirety, as little as 30, 40, 50, as high as 60, 70, 80, or greater, or within any range defined between any two of the foregoing values. In some exemplary embodiments, each of the first and second surface layers 14, 16 is independently less than the thickness of the central layer 12. In some exemplary embodiments, each of the first and second surface layers 14, 16 has a thickness as little as 0.05 mm, 0.1 mm, 0.25 mm, 0.5 mm, as great as 1 mm, 2 mm, 5 mm, or within any range defined between any two of the foregoing values. In some exemplary embodiments, each of the first and second surface layers 14, 16 has a thickness less than 5 mm, a thickness less than 1 mm, a thickness less than 0.5 mm, a thickness less than 0.25 mm, or a thickness less than 0.1 mm.

In some exemplary embodiments, each of the first and second surface layers 14, 16 comprise one or more thermal conductive fillers, a polymer matrix, at least one wax, and optional additives.

a. Thermally Conductive Filler

In some embodiments, each surface layer 14, 16 includes one or more thermally conductive fillers. Each surface layer 14, 16 may independently comprise the one or more thermally conductive fillers in an amount as little as 70 wt. %, 75 wt. %, 80 wt. %, 85 wt. %, as great as 90 wt. %, 95 wt. %, 99 wt. %, or within any range defined between any two of the foregoing values, based on the total weight of each surface layer 14, 16. In a more particular embodiment, the weight percentage of thermally conductive filler in each of the first surface layer 14 and second surface layer 16 is independently from 85 wt. % to 99 wt. % based on the total weight of each surface layer 14, 16.

b. Polymer Matrix

In some exemplary embodiments, each surface layer 14, 16 further comprises a polymer. In some embodiments, the polymer is polyethylene-butylene mono-ol. Each surface layer 14, 16 may independently comprise the one or more polymers in an amount as little as 0.1 wt. %, 0.5 wt. %, 1 wt. %, 5 wt. %, as great as 8 wt. %, 10 wt. %, 20 wt. %, or within any range defined between any two of the foregoing values, based on the total weight of each surface layer 14, 16.

c. Phase Change Material

In some embodiments, each surface layer 14, 16 independently comprises one or more phase change materials, such as a wax. In some exemplary embodiments, each surface layer 14, 16 may comprise the one or more phase change materials in an amount as little as 0.1 wt. %, 0.5 wt. %, 1 wt. % as great as 2 wt. %, 3 wt. %, 5 wt. %, 10 wt. %, or within any range defined between any two of the foregoing values, based on the total weight of the first surface layer 14 or second surface layer 16. In some embodiments, each surface layer 14, 16, includes a total softener content of soft waxes and silicone gel having a needle penetration value no less than 70 in an amount as little as 0.1 wt. %, 0.5 wt. %, 1 wt. % as great as 2 wt. %, 3 wt. %, 5 wt. %, or within any range defined between any two of the foregoing values, based on the total weight of the first surface layer 14 or second surface layer 16.

d. Additives

In some exemplary embodiments, the first surface layer 14 and second surface layer 16 independently comprise one or more additives. In some exemplary embodiments, the central layer 12 may comprise the one or more additives in an amount as little as 0.1 wt. %, 0.5 wt. %, 1 wt. % as great as 1.5 wt. %, 2 wt. %, 5 wt. %, 10 wt. %, or within any range defined between any two of the foregoing values, based on the total weight of the first surface layer 14 or second surface layer 16.

B. Methods of Forming a Compressible Thermal Interface Material

In some embodiments, the TIM 10 is formed from a dispensable formulation including one or more polymers, one or more phase change materials, one or more thermally conductive fillers, one or more solvents, and, optionally, one or more additives. Dispensable materials are typically paste-based material. In a typical embodiment, the dispensable material has a viscosity such that, when a suitable pressure or force is applied to the material, a portion of the material is pushed out of a container through a relatively narrow hole (dispense head). In some exemplary embodiments, the TIM materials are filled in a syringe, and the filled TIM can be pushed out from the syringe head or needle on to the surface of a heat spreader, chip, and/or heatsink. In some embodiments, the TIM is dispersed on to the surface in a customized pattern under the desired pressure. Typical dispensable parameters may include, but not limited to press force, dispense head size, dispense speed, and average pattern thickness.

Exemplary solvents are described in U.S. Patent Application Publication 2007/0517733, the disclosure of which is hereby incorporated by reference herein in its entirety. Suitable solvents include pure solvents or mixtures of organic or inorganic solvents that are volatilized at a desired temperature, such as the critical temperature, or that can facilitate any of the above-mentioned design goals or needs, and that are compatible with the phase change materials, in that they will interact with the phase change materials to achieve the previously-mentioned goals. In some embodiments, the solvent, solvent mixture or combination thereof will solvate the phase change material such that it can be applied by printing techniques. In some exemplary embodiments, the solvent or mixture of two or more solvents are selected from the hydrocarbon family of solvents. Hydrocarbon solvents comprise carbon and hydrogen. A majority of hydrocarbon solvents are non-polar; however, there are a few hydrocarbon solvents that are considered polar.

Hydrocarbon solvents are generally classified into three classes: aliphatic, cyclic and aromatic. Aliphatic hydrocarbon solvents comprise both straight-chain compounds and compounds that are branched and possibly crosslinked, however, aliphatic hydrocarbon solvents are not typically considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together. In some exemplary embodiments, the solvent or mixture of two or more solvents are selected from solvents that are not considered part of the hydrocarbon solvent family of compounds, such as ketones, alcohols, esters, ethers and amines. In yet other contemplated embodiments, the solvent or solvent mixture may comprise a combination of any of the solvents mentioned herein.

Exemplary hydrocarbon solvents include toluene, xylene, p-xylene, m-xylene, mesitylene, solvent naphtha H, solvent naphtha A, Isopar H and other paraffin oils and isoparaffinic fluids, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, ligroine. Exemplary ketone solvents include acetone, diethyl ketone, methyl ethyl ketone and the like.

In one exemplary embodiment, the solvent includes one or more solvents selected from: pentane, hexane, heptane, cyclohexane, paraffin oils, isoparaffinic fluids, benzene, toluene, xylene and mixtures or combinations thereof. Exemplary isoparafinnic fluids include Isopar H, Isopar L, and Isopar M, available from Exxon Mobile Chemical. In some exemplary embodiments, the formulation may comprise the one or more solvents in an amount as little as 0.1 wt. %, 0.5 wt. %, 1 wt. % as great as 5 wt. %, 10 wt. %, 20 wt. %, 25 wt. % or within any range defined between any two of the foregoing values, based on the total weight of the formulation.

In some exemplary embodiments, the formulation has a viscosity as little as 500 centipoise, 1,000 centipoise, 5,000 centipoise, 10,000 centipoise, centipoise, as great as 150,000 centipoise, 1,000,000 centipoise, 100,000,000 centipoise, or within any range defined between any two of the foregoing values, when tested at room temperature using a viscometer according to DIN 53018, the disclosures of which are hereby incorporated by reference in their entirety.

In some exemplary embodiments, a method of forming a TIM 10 is provided. In some exemplary embodiments, forming the TIM 10 includes processes such as baking and drying the TIM 10.

In some exemplary embodiments, baking the TIM 10 include baking at a temperature as low as 25° C., 50° C., 75° C., 80° C., as high as 100° C., 125° C., 150° C., 170° C., or within any range defined between any two of the foregoing values. In some exemplary embodiments, the TIM 10 is baked for as little as 0.5 minutes, 1 minute, 30 minutes, 1 hour, 2 hours, as long as 8 hours, 12 hours, 24 hours, 36, hours, 48 hours, or within any range defined between any two of the foregoing values.

C. Thermal Interface Material Properties

In one exemplary embodiment, the TIM 10 is a compressible thermal interface material. Compressibility is measured by applying a predetermined pressure to a material and determining the change in the thickness of the material. Compressibility is typically reported as a percent of the original thickness.

In some exemplary embodiments, the TIM 10 is compressible while maintaining good thermal properties. In some exemplary embodiments, the use of a compressible TIM 10 allows an improved contact with the electronic components and heat dissipation components, such as electronic component 30 or heat sink 32 (see FIGS. 1A-1D). In some exemplary embodiments, the use of a compressible TIM 10 provides a reduction in the thermal contact resistance by providing better contact between the surfaces of the electronic components and heat dissipation components, such as electronic component 30 or heat sink 32 (see FIGS. 1A-1D). In some exemplary embodiments, the use of a compressible TIM 10 allows for a greater variation in the tolerance or flatness of electronic components and heat dissipation components, such as electronic component 30 or heat sink 32 (FIGS. 1A-1D). In some exemplary embodiments, the use of a compressible TIM 10 allows for excellent heat transfer performance, even following component distortion or warping due to elevated temperatures.

In an exemplary embodiment, compressibility is determined by positioning a 1.3 cm by 1.3 cm sample between two 1.3 cm by 1.3 cm copper plates. The original thickness of the sample is determined by subtracting the thickness of the copper plates from the original thickness of the copper-sample-copper composite. The copper-sample-copper composite is submitted to a predetermined pressure for two minutes. After two minutes, the thickness of the copper-sample-copper composite is again measured. The compressed thickness of the sample is determined by subtracting the thickness of the copper plates from the compressed thickness of the copper-sample-copper composite. Compressibility of the sample is calculated as the (original sample thickness−compressed sample thickness)/original sample thickness*100%.

In some embodiments, when subjected to a pressure of 40 psi, the TIM 10 has a compressibility as little as at least 5%, at least 10%, at least 15%, at least 20%, at least 30%, and as high as at least 40%, at least 50%, at least 60%, at least 70%, at least 80%, or within any range defined between any two of the foregoing values. In some exemplary embodiments, the TIM returns to its original thickness following release of the pressure. In other exemplary embodiments, the TIM does not return to its original thickness following release of the pressure.

The degree to which the TIM 10 returns to its original thickness may be determined using a spring back ratio. In an exemplary embodiment, the spring back ratio is determined by applying a predetermined pressure, such as 2 psi, to a sample for a first predetermined period of time, such as ten minutes. Following the first predetermined period of time, the pressure is released, and the sample is allowed to rest for a second predetermined period of time, such as twenty minutes. The spring back ratio is determined by:

(sample thickness following second period−sample thickness following first period)/(original sample thickness−sample thickness following first period)*100%.

In some embodiments, a low spring back ratio is desired. In some embodiments, the TIM 10 has a spring back ratio of less than 50%, less than 40%, less than 30%, less than 25%, less than 20%, less than 10%, less than 5%, or 0, or within any range defined between any two of the foregoing values.

In some exemplary embodiments, the TIM 10 has a thermal impedance as little as 0.05° C. cm$^2$/W, 0.1° C. cm$^2$/W, 0.5° C. cm$^2$/W, 0.75° C. cm$^2$/W, as high as 1° C. cm$^2$/W, 1.5° C. cm$^2$/W, 2° C. cm$^2$/W, 2.5° C. cm$^2$/W, or within any range defined between any two of the foregoing values.

In some exemplary embodiments, the TIM 10 has a thermal impedance following conditioning at a temperature of 130° C. and a relative humidity of 85% for 96 hours that is no more than 20% greater, no more than 10% greater, no more than 5% greater, or no more than the thermal impedance of the TIM 10 prior to said conditioning.

In some exemplary embodiments, the Tim 10 has a thermal impedance following conditioning at a temperature of 150° C. for 200 hours that is no more than 20% greater, no more than 10% greater, no more than 5% greater, or no more than the thermal impedance of the TIM 10 prior to said conditioning.

EXAMPLES

A. Compressible Thermal Interface Materials

TABLE 1

| | FORMULATIONS | | | | |
| --- | --- | --- | --- | --- | --- |
| Product | Comp. Ex. 1 | Comp. Ex. 2 | Ex. 1 | Ex. 2 | Ex. 3 |
| Polymer - Kraton L-1203 | 17.2 g | 16 g | 15 g | 17.2 g | 17.2 g |

TABLE 1-continued

FORMULATIONS

| Product | Comp. Ex. 1 | Comp. Ex. 2 | Ex. 1 | Ex. 2 | Ex. 3 |
|---|---|---|---|---|---|
| Phase change material - TAC Wax | | | 0.5 g | 0.4 g | 0.4 g |
| Phase change material - AC 1702 | 6.2 g | | | 4 g | 4 g |
| Phase change material - PEW 0602F | | | 0.5 g | 1.8 g | 1.8 g |
| Additive - LICA 38 | | 1.34 g | 1.34 g | | 3 g |
| Additive - TTS | 3 g | | | 3 g | |
| Additive - Irganox 1076 | 0.4 g | 1.0 g | 1 g | 0.4 g | 0.4 g |
| Additive - Cymel 1156 | 1.2 g | | | 1.2 g | 1.2 g |
| Thermal conductive filler - Aluminum powder | 172 g | 181.66 g | 181.66 g | 172 g | 172 g |

The Kraton L-1203 is hydrogenated polybutadiene polymer available from Kurary Co., Ltd. The TAC wax is available from The International Group, Inc. The AC-1702 is a polyethylene wax available from Honeywell International Inc. The PEW-0602F wax is a polytetrafluoroethylene-polyethylene wax mixture available from Nanjing Tianshi New Material Technologies. The LICA 38 is a coupling agent additive available from Kenrich Petrochemical. The TTS is a coupling agent additive available from Kenrich Petrochemical. The Irganox 1076 is an antioxidant additive available from BASF. The Cymel 1156 is a crosslinking agent additive available from CYTEC. The thermal conductive filler was aluminum particles having a diameter between about 0.1 microns and 50 microns.

1. Comparative Example 1

The phase change material (AC 1702), polymer (Kraton L-1203), additives (Irganox 1076, Cymel 1156, and TTS), and thermal conductive filler (aluminum powder) were added to a reactor in the amounts listed in Table 1. The mixture was stirred under 100° C. until a uniform dispersion was formed.

Figure 3:
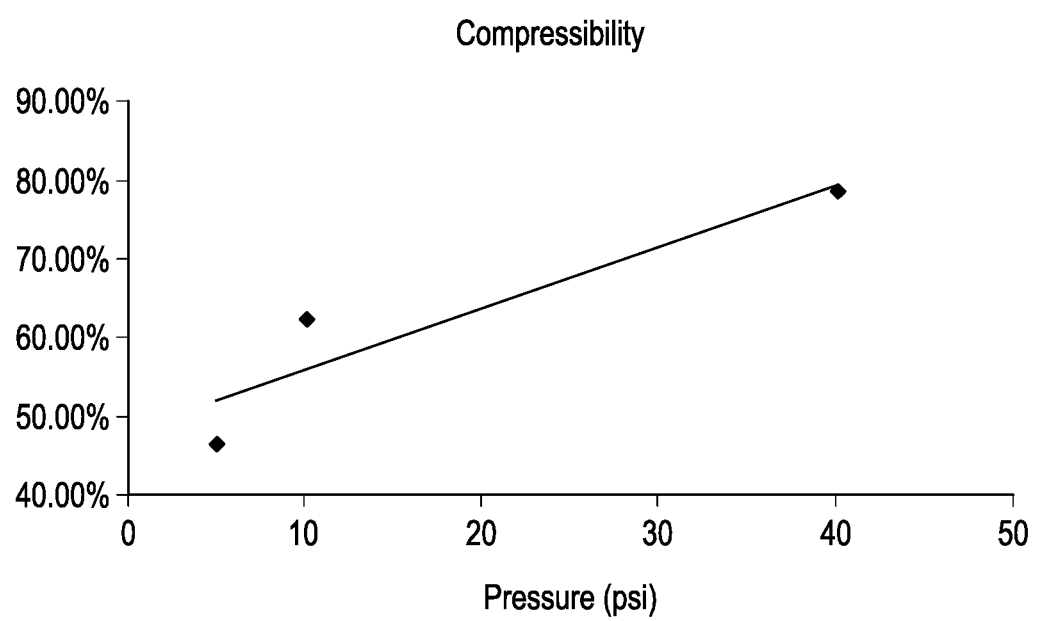
FIG. 3 is related to comparative example 1 and is a chart showing compressibility at various pressures.

Comparative example 1 was coated at 100° C. between two layers of polyethylene terephthalate (PET) film. The compressibility of comparative example 1 is presented in FIG. 3.

2. Comparative Example 2

The polymer (Kraton L-1203), additives (Irganox 1076 and LICA 38), and thermal conductive filler (aluminum powder) were added to a reactor in the amounts listed in Table 1. The mixture was stirred under 150° C. until a uniform dispersion was formed.

Figure 4A:
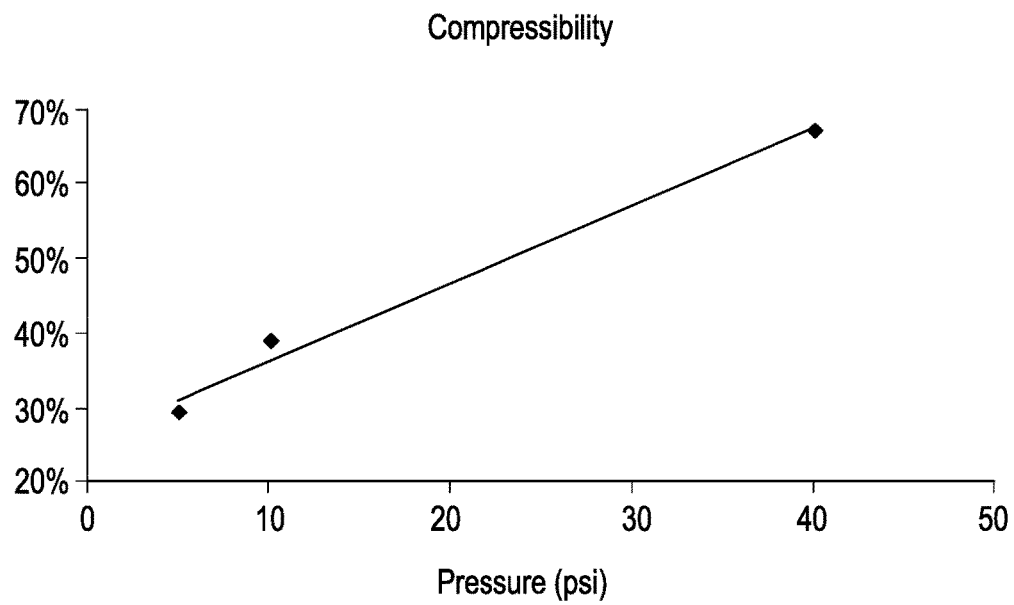
FIG. 4A is related to comparative example 2 and is a chart showing compressibility at various pressures.
Figure 4B:
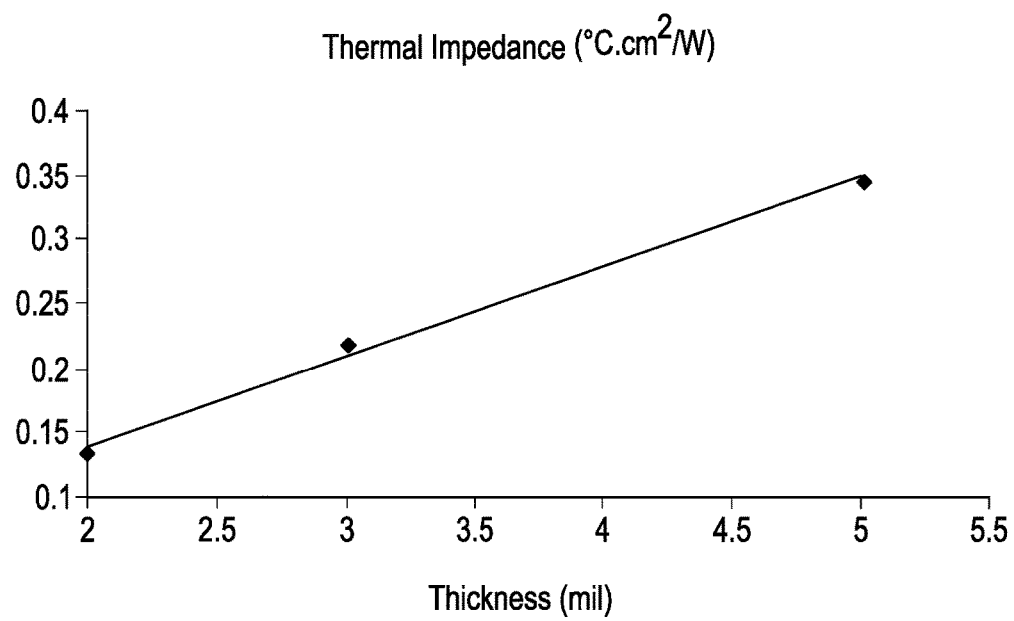
FIG. 4B is related to comparative example 2 and is a chart showing thermal impedance at various pressures.

Comparative example 2 was coated at 80° C. between two layers of polyethylene terephthalate (PET) film. The compressibility of comparative example 2 is presented in FIG. 4A. The thermal impedance of comparative example 2 is presented in FIG. 4B.

The thermal conductivity of comparative example 2 was determined to be 3.64 W/m-K.

Comparative example 2 was tested using a Highly Accelerated Stress Test (HAST test) in which the sample was conditioned at a temperature of 130° C. and a relative humidity of 85% for 96 hours in an environmental chamber supplied by ESPEC. The thermal impedance of the sample was determined before or after the sample conditioning. An increase of less than 20% in thermal impedance indicated a passing HAST result, while an increase of 20% or more indicated a failing HAST result.

Comparative example 2 was also tested using a baking test in which the sample was conditioned at a temperature of 150° C. for 200 hours in an environmental chamber supplied by ESPEC. The thermal impedance of the sample was determined before or after the sample conditioning. An increase of less than 20% in thermal impedance indicated a passing baking test result, while an increase of 20% or more indicated a failing baking test result.

Comparative example 2 passed the HAST test and failed the Baking test.

3. Example 1

The phase change materials (TAC wax, PEW-0602F), polymer (Kraton L-1203), additives (Irganox 1076, and LICA 38), and thermal conductive filler (aluminum powder) were added to a reactor in the amounts listed in Table 1. The mixture was stirred under 150° C. until a uniform dispersion was formed.

Figure 5A:
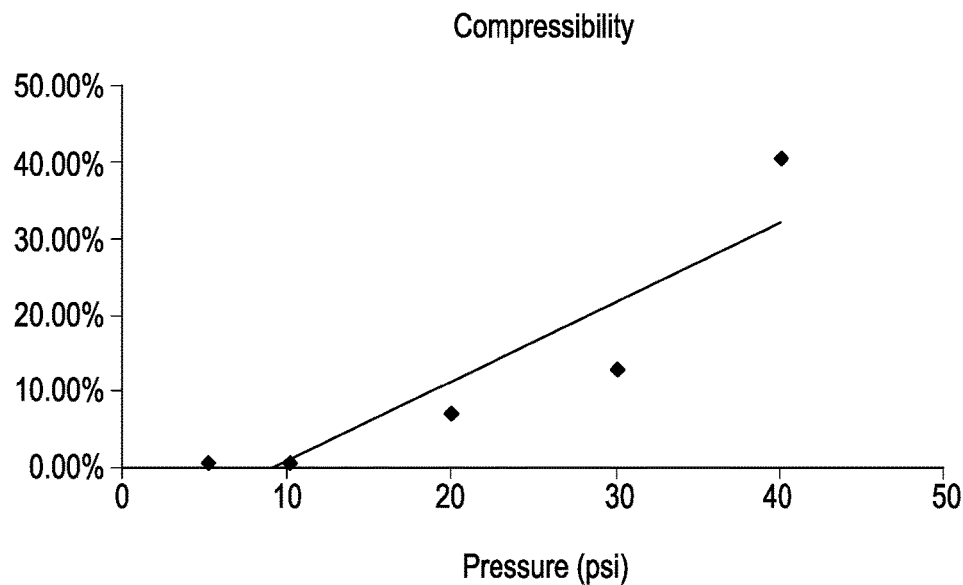
FIG. 5A is related to example 1 and is a chart showing compressibility at various pressures.
Figure 5B:
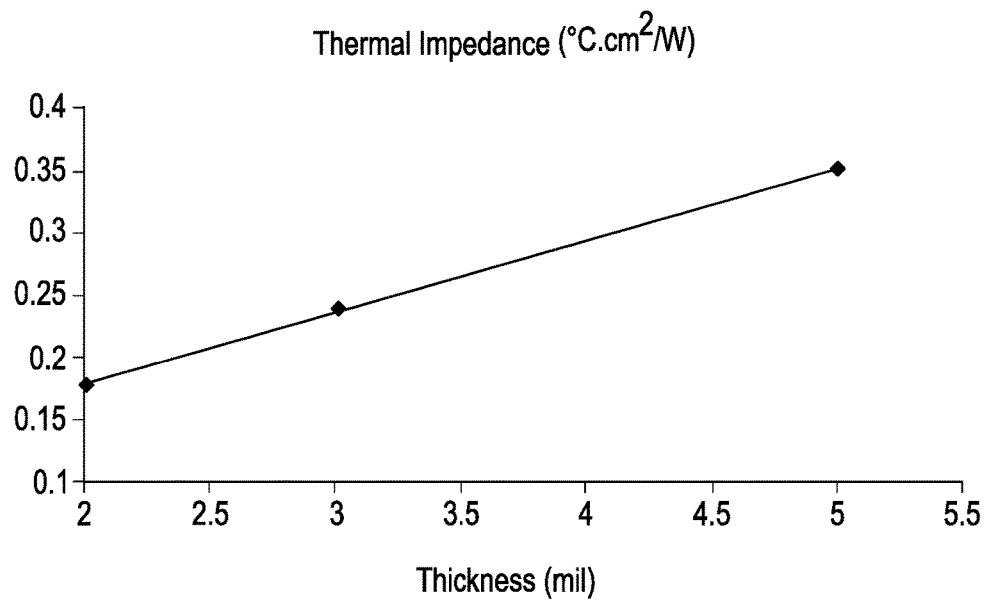
FIG. 5B is related to example 1 and is a chart showing thermal impedance at various pressures.

Example 1 was coated at 80° C. between two layers of polyethylene terephthalate (PET) film. The compressibility of example 1 is presented in FIG. 5A. The thermal impedance of example 1 is presented in FIG. 5B.

The thermal conductivity of example 1 was determined to be 4.41 W/m-K. Example 1 passed the HAST test.

4. Example 2

The phase change materials (TAC wax, AC 1702, PEW-0602F), polymer (Kraton L-1203), additives (Irganox 1076, Cymel 1156, LICA 38, and TTS), and thermal conductive filler (aluminum powder) were added to a reactor in the amounts listed in Table 1. The mixture was stirred under 100° C. until a uniform dispersion was formed.

Figure 6A:
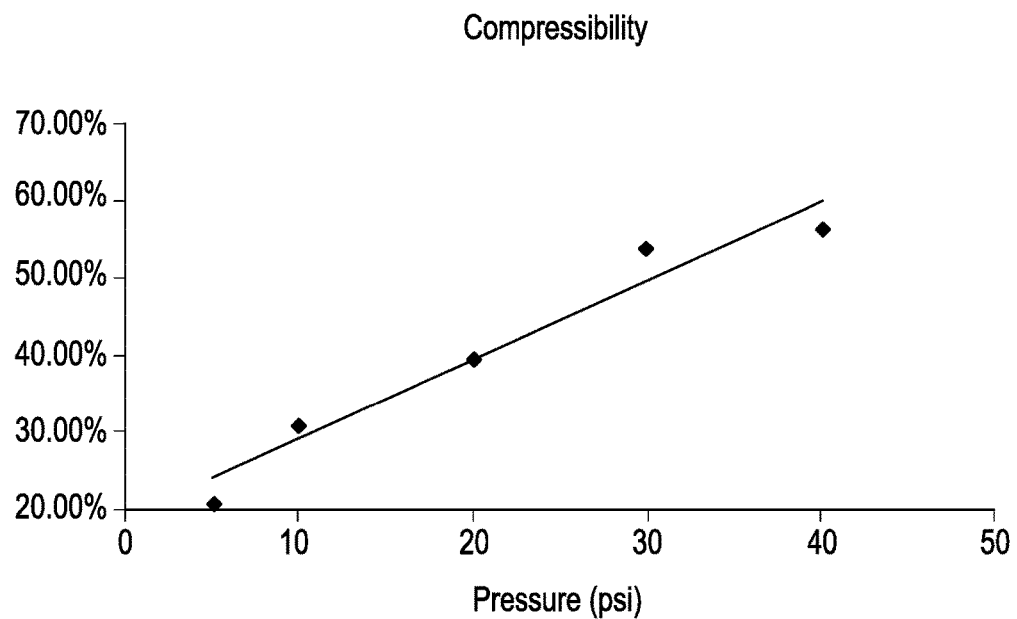
FIG. 6A is related to example 2 and is a chart showing compressibility at various pressures.
Figure 6B:
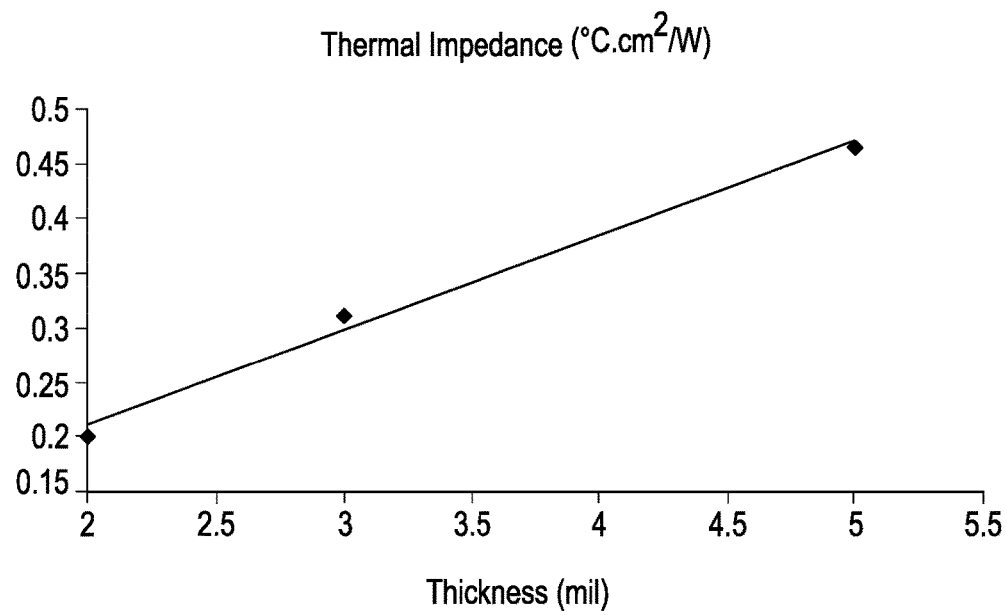
FIG. 6B is related to example 2 and is a chart showing thermal impedance at various pressures.

Example 2 was coated at 100° C. between two layers of polyethylene terephthalate (PET) film. The compressibility of example 2 is presented in FIG. 6A. The thermal impedance of example 2 is presented in FIG. 6B.

The thermal conductivity of example 2 was determined to be 2.94 W/m-K. Example 2 failed the HAST test and Baking test.

6. Example 3

Figure 7A:
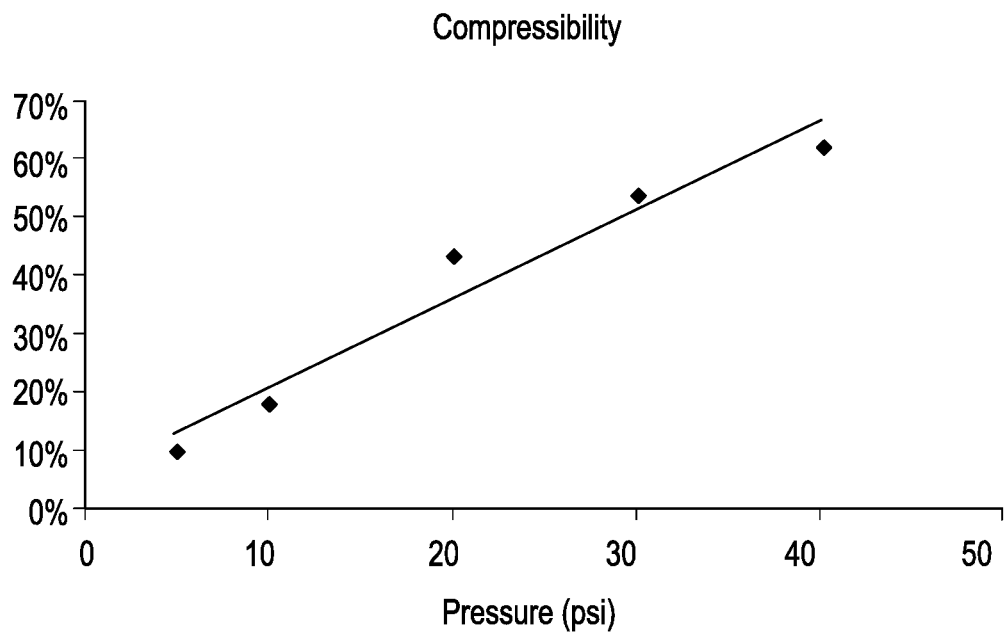
FIG. 7A is related to example 3 and is a chart showing compressibility at various pressures.
Figure 7B:
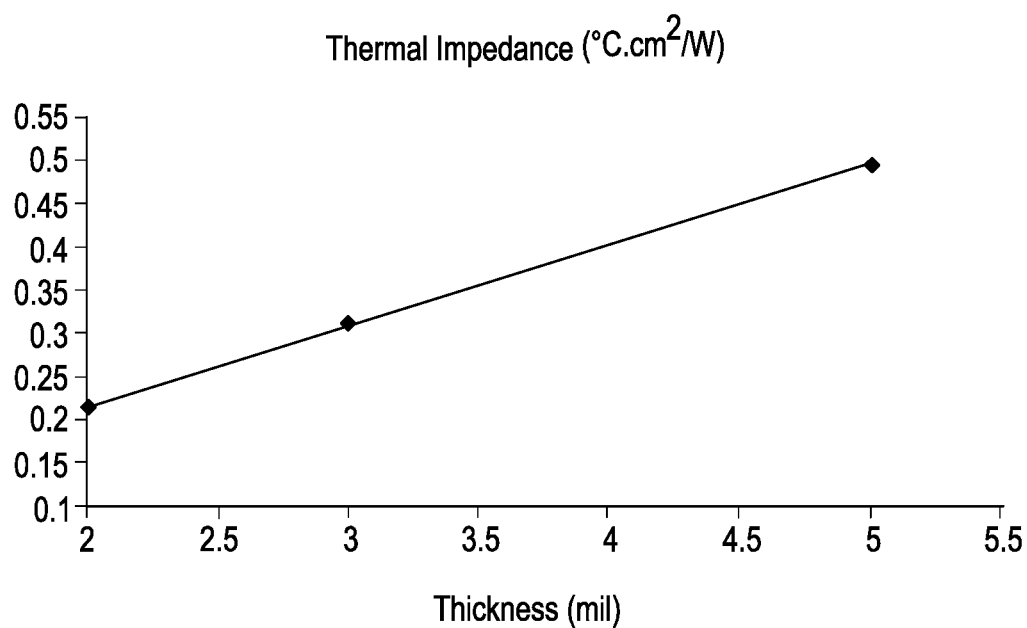
FIG. 7B is related to example 3 and is a chart showing thermal impedance at various pressures.

The phase change materials (TAC wax, AC 1702, PEW-0602F), polymer (Kraton L-1203), additives (Irganox 1076, Cymel 1156, LICA 38, and TTS), and thermal conductive filler (aluminum powder) were added to a reactor in the amounts listed in Table 1. The mixture was stirred under 150° C. until a uniform dispersion was formed Example 3 was coated at 100° C. between two layers of polyethylene terephthalate (PET) film. The compressibility of example 3 is presented in FIG. 7A. The thermal impedance of example 3 is presented in FIG. 7B.

The thermal conductivity of example 3 was determined to be 2.72 W/m-K. Example 2 passed the HAST test and failed the Baking test.

7. Springback Testing

Figure 8A:
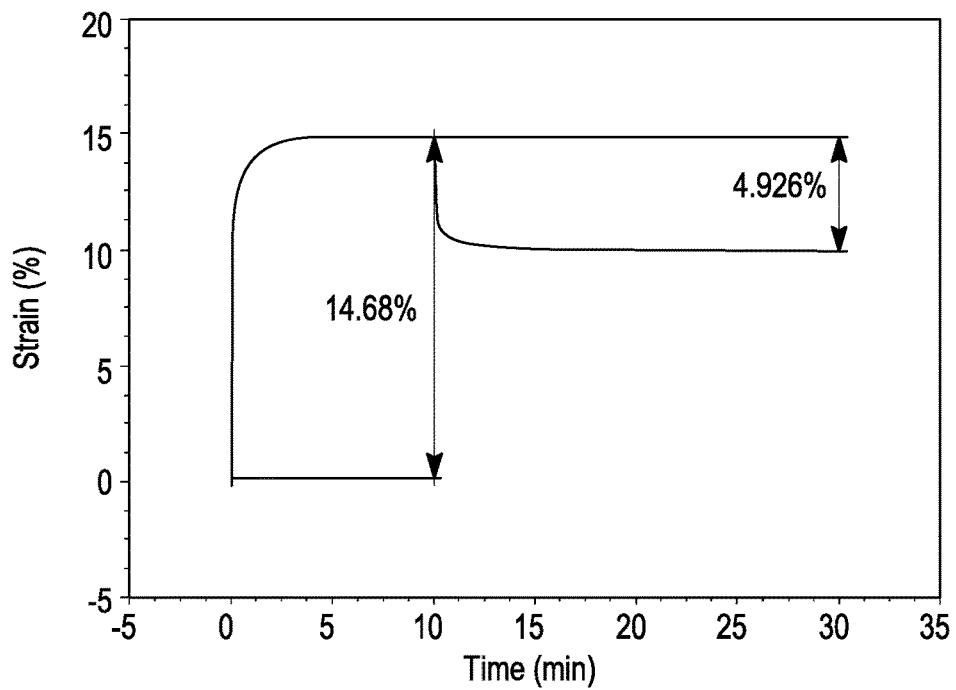
FIG. 8A is related to example 2 and is a chart showing the springback of the material.
Figure 8B:
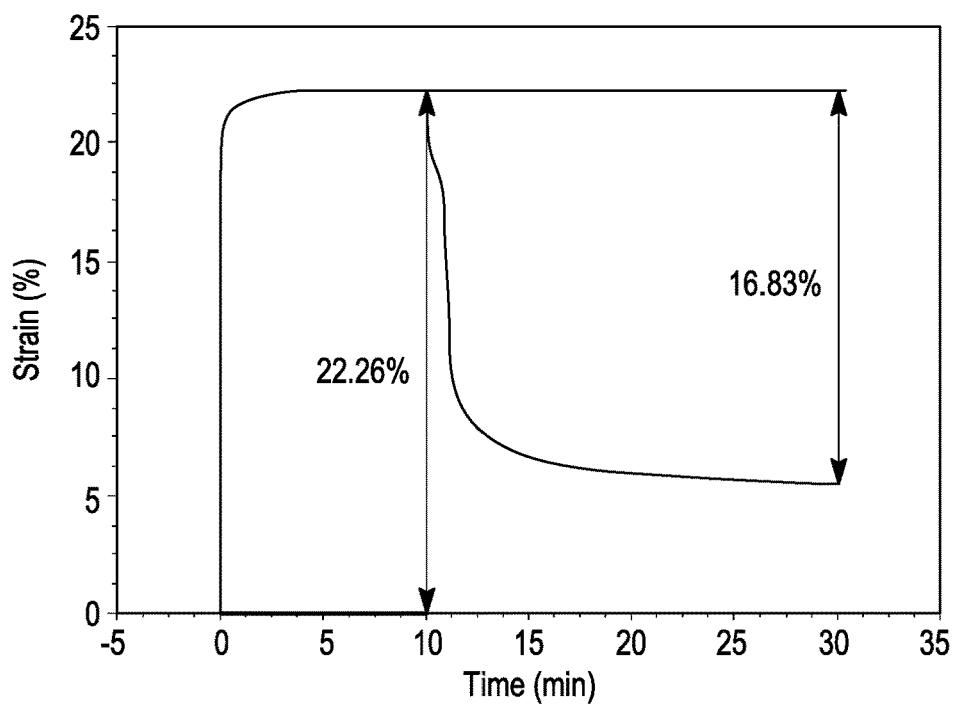
FIG. 8B is a chart showing the springback of a Laird 360 pad.

A sample of Example 2, of a GP3000S30 putty pad, available from Bergquist Company, Chanhassen, Minn., USA, and of a TFLEX360 gap pad, available from Laird Technologies, Laird PLC, London, England, United Kingdom, were each compressed at 2 psi. After 10 minutes, the compressibility was determined as a percentage of the originally thickness, and the strain was released. After 20 minutes, the spring back was determined as a percentage of the original height. The spring back ratio was determined by dividing the % spring back by the % compressibility. The results of the testing for Example 2 are shown in FIG. 8A, and for the Laird pad in FIG. 8B, and are summarized in Table 2 below.

TABLE 2

SPRINGBACK TESTING RESULTS

| Product | Example 2 | GP3000S30 | TFLEX 360 |
|---|---|---|---|
| Compressibility under 2 psi | 14.68% | 6.03% | 22.26% |
| Spring back after removal strength | 4.93% | 2.00% | 16.83% |
| Spring back ratio (%) | 33.6 | 33.2 | 75.6 |

B. Silicone Gel

PTM3180, 200 g bulk, available from Honeywell International Inc., was placed into a Ross mixture with an oil temperature of 100° C. for about 30 minutes. After the bulk PTM3180 melted completely, 3 g TSE3051 ST silicone gel, supplied by Momentive, was added to the mixer. The PTM3180 and silicone gel were mixed at 20 rpm for 30 minutes.

The compressibility and thermal impedance of the PTM 3180 containing the silicone gel material was compared with that of the PTM 3180. The results are presented in Table 3.

TABLE 3

SILICONE GEL RESULTS

| | Compressibility (%) | Thermal Impedance (° C. · cm²/w) | Thermal Conductivity (w/(m · k)) |
|---|---|---|---|
| 1.5% Gel + PTM3180 | 33% | 0.089 | 3.16 |
| PTM3180 | 0% | 0.083 | 4.4 |

The compressibility of the composite including the gel was about 33% at 40 psi, compared to nearly 0% for the PTM3180 material. The thermal conductive and thermal impedance of the silicone gel composite were tested according to ASTMD5470 and thermal conductivity was found to be 3.16 W/mK, and the thermal impedance was found to be 0.089° C. cm²/W. As shown in Table 4, the silicone gel composite material also passed the HAST test.

TABLE 4

SILICONE GEL HAST TEST RESULTS

| Materials | Sample No | Thermal Impedance (AC) | Thermal Impedance (HAST96 hr) |
|---|---|---|---|
| PTM3180 + Gel | 1 | 0.10 | 0.11 |
| | 2 | 0.10 | 0.10 |
| | 3 | 0.11 | 0.12 |
| | 4 | 0.11 | 0.11 |
| | 5 | 0.10 | 0.10 |

C. Multilayer Thermal Interface Materials

1. Comparative Examples

The thermal impedance of a 1 mm thickness TFLEX 640 gap pad, available from Laird Technologies, Laird PLC, London, England, United Kingdom, and a 1.5 mm thickness TFLEX 380 gap pad, also available from Laird Technologies, was determined at 70° C. using a thermal impedance tester from Longwin 9091IR following ASTM D5470, the disclosures of which is hereby incorporated by reference in its entirety.

The thermal impedance of each pad is provided in Table 5.

2. PCM45F Surface Layers

The gap pad TFLEX 640 was selected as the matrix of the central layer TIM, and cut to a size of 25×25 mm. A 25×25 mm piece of PCM45F, available from Honeywell International Inc., Morristown N.J., was applied to each of the top and bottom sides of the TFLEX 640 pad. The thermal impedance of the multilayered TIM was determined using a thermal impedance tester following ASTM D5470.

The gap pad TFLEX 380 was selected as the matrix of the central layer TIM, and cut to a size of 25×25 mm. A 25×25 mm piece of PCM45F, available from Honeywell International Inc., Morristown N.J., was applied to each of the top and bottom sides of the TFLEX 380 pad. The thermal impedance of the multilayered TIM was determined using a thermal impedance tester following ASTM D5470.

The thermal impedance of each composite TIM is provided in Table 5.

3. PCM45F-SP Surface Layers

The gap pad TFLEX 640 was selected as the matrix of the central layer TIM, and cut to a size of 25×25 mm. PCM45-SP, available from Honeywell International Inc., Morristown N.J., was printed on each of the top and bottom sides of the TFLEX 640 pad then baked at 80° C. for 30 minutes for solvent drying. The thermal impedance of the multilayered TIM was determined using a thermal impedance tester following ASTM D5470.

The thermal impedance of the composite TIM is provided in Table 5.

4. Thermal Grease Surface Layers

The gap pad TFLEX640 was selected as the matrix of the central layer TIM, and cut to a size of 25×25 mm. Thermal grease, TC5026, available from Dow Corning, Midland Mich., was printed on each of the top and bottom sides of the TFLEX 640 pad. The thermal impedance of the multilayered TIM was determined using a thermal impedance tester following ASTM D5470.

The thermal impedance of the composite TIM is provided in Table 5.

5. PTM3180 with Gel Surface Layers

The gap pad TFLEX 640 was selected as the matrix of the central layer TIM, and cut to a size of 25×25 mm. A 25×25 mm piece of PTM3180 with gel, available from Honeywell International Inc., Morristown N.J., was applied to each of the top and bottom sides of the TFLEX 640 pad. The thermal impedance of the multilayered TIM was determined using a thermal impedance tester following ASTM D5470.

The thermal impedance of the composite TIM is provided in Table 5.

6. PCM45F and PTM3180 Surface Layers

The gap pad TFLEX 640 was selected as the matrix of the central layer TIM, and cut to a size of 25×25 mm. A 25×25 mm piece of PCM45F, available from Honeywell International Inc., Morristown N.J., was applied to one side of the TFLEX 640pad. A 25×25 mm piece of PTM3180, available from Honeywell International Inc., Morristown N.J., was applied to the opposite side of the TFLEX 640 pad. The thermal impedance of the multilayered TIM was determined using a thermal impedance tester following ASTM D5470.

The thermal impedance of the composite TIM is provided in Table 5.

7. TS27 Surface Layers

The gap pad TFLEX 640 was selected as the matrix of the central layer TIM, and cut to a size of 25×25 mm. A 25×25 mm piece of TS27 a compressible thermal interface material comprising a polymer, a hard wax and a soft wax and a thermally conductive filler was applied to each of the top and bottom sides of the TFLEX 640 pad. The thermal impedance of the multilayered TIM was determined using a thermal impedance tester following ASTM D5470.

The thermal impedance of the composite TIM is provided in Table 5.

TABLE 5

THERMAL IMPEDANCE OF MULTILAYERED TIMS

| Product | Original Thickness (mm) | Thermal Impedance (° C. · cm$^2$/W) |
|---|---|---|
| TFLEX 640 | 1 | 2.77 |
| TFLEX 380 | 1.5 | 7.2 |
| PCM45F + TFLEX 640 + PCM45F | 1.5 | 1.8 |
| PCM45F + TFLEX 380 + PCM45F | 2 | 2.4 |
| PCM45F-SP + TFLEX 640 + PCM45-SP | 1.5 | 1.8 |
| TC5026 + TFLEX 640 + TC5026 | 1.5 | 1.515 |
| PCM45F + TFLEX 640 + PTM3180 | 1.5 | 1.1 |
| PTM3180 with gel + TFLEX 640 + PTM3180 with gel | 1.5 | 0.74 |
| TS27 + TFLEX 640 + TS27 | 1.5 | 1.061 |

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A compressible thermal interface material comprising:
   at least one polymer;
   at least one thermally conductive filler; and
   at least one phase change material, wherein the at least one phase change material includes a wax having a needle penetration value of at least 50 as determined at 25° C. according to ASTM D1321.

2. The compressible thermal interface material of claim 1, wherein the compressible thermal interface material has a compressibility of at least 5% under an applied contact pressure of 40 psi.

3. The compressible thermal interface material of claim 1, wherein the compressible thermal interface material has a springback ratio of 50% or less.

4. The compressible thermal interface material of claim 1, wherein the at least one phase change material comprises a second wax, the second wax having a needle penetration value of less than 50 as determined at 25° C. according to ASTM D1321.

5. The compressible thermal interface material of claim 1, wherein the at least one phase change material comprises a wax selected from the group consisting of: a polyethylene wax, a copolymer of ethylene-vinyl acetate wax, and an oxidized polyethylene wax.

6. The compressible thermal interface material of claim 1, wherein the at least one thermally conductive filler includes a filler selected from the group consisting of metals, alloys, nonmetals, metal oxides, ceramics, and combinations thereof.

7. The compressible thermal interface material of claim 1, wherein the at least one thermally conductive filler comprises 10 wt. % to 95 wt. % of the total weight of the compressible thermal interface material.

8. The compressible thermal interface material of claim 1, wherein the at least one polymer includes a polymer is selected from the group consisting of: ethylene-propylene rubbers (EPR), ethylene-propylene diene monomer rubbers (EPDM), polyethylene-butylene, and polyethylene-butylene-styrene, polybutadiene, hydrogenated polybutadiene mono-ol, hydrogenated polypropadiene mono-ol, hydrogenated polypentadiene mono-ol, polybutadiene diol, hydrogenated polypropadiene diol, and hydrogenated polypentadiene diol.

9. The compressible thermal interface material of claim 1, wherein the at least one polymer is hydrogenated polybutadiene.

10. The compressible thermal interface material of claim 1, further comprising at least one coupling agent, at least one antioxidant, and at least one crosslinking agent.

11. The compressible thermal interface material of claim 1, further comprising at least one silicone gel.

12. The compressible thermal interface material of claim 1, further comprising:
   a middle layer comprising the at least one polymer, the at least one thermally conductive filler, and the wax having a needle penetration value of at least 50 as determined at 25° C. according to ASTM D1321;
   a first surface layer including at least one phase change material and at least one thermally conductive filler, the first surface layer contacting a first surface of the middle layer; and a second surface layer including at least one phase change material and at least one thermally conductive filler, the second surface layer contacting a second surface of the middle layer.

13. The compressible thermal interface material of claim 12, wherein a weight percentage content of the at least one thermally conductive filler in the middle layer is less than or equal to the weight percentage content of at least one thermally conductive filler in at least one of the first and second surface layers.

14. The compressible thermal interface material of claim 12, wherein the weight percentage of the at least one thermally conductive filler in each of the first and second surface layers is independently from about 70 wt. % to about 99 wt. %.

15. A formulation for forming a compressible thermal interface material comprising:
   at least one solvent;
   at least one polymer;
   at least one thermally conductive filler; and
   at least one phase change material, wherein the at least one phase change material includes a wax having a needle penetration value of at least 50 as determined at 25° C. according to ASTM D1321.

16. The formulation of claim 15, wherein the formulation has a viscosity of 1,000 centipoise to 100,000,000 centipoise.

17. An electronic component comprising:
   a heat sink;
   an electronic chip;
   a compressible thermal interface material positioned between the heat sink and electronic chip, the compressible thermal interface material including: at least one polymer, at least one thermally conductive filler, and at least one wax having a needle penetration value of at least 50 as determined at 25° C. according to ASTM D1321.

18. The electronic component of claim 17, wherein a first surface of the compressible thermal interface material is in contact with a surface of the electronic chip and a second surface of the compressible thermal interface material is in contact with the heat sink.

19. The electronic component of claim 17, further comprising a heat spreader positioned between the heat sink and the electronic chip, wherein a first surface of the compressible thermal interface material is in contact with a surface of the electronic chip and a second surface of the compressible thermal interface material is in contact with the heat spreader.

20. The electronic component of claim 17, further comprising a heat spreader positioned between the heat sink and the electronic chip, wherein a first surface of the compressible thermal interface material is in contact with a surface of the heat spreader and a second surface of the compressible thermal interface material is in contact with the heat sink.

* * * * *